United States Patent
Kim et al.

(10) Patent No.: US 10,939,514 B2
(45) Date of Patent: Mar. 2, 2021

(54) ELECTROLUMINESCENCE DISPLAY AND METHOD FOR DRIVING THE SAME

(71) Applicant: LG Display Co., Ltd., Seoul (KR)

(72) Inventors: Gyungmin Kim, Paju-si (KR); Beomjin Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 58 days.

(21) Appl. No.: 16/002,197

(22) Filed: Jun. 7, 2018

(65) Prior Publication Data
US 2019/0021151 A1    Jan. 17, 2019

(30) Foreign Application Priority Data

Jul. 17, 2017 (KR) .......... 10-2017-0090363

(51) Int. Cl.
| | | |
|---|---|---|
| H05B 33/10 | (2006.01) | |
| H01L 51/56 | (2006.01) | |
| G09G 3/3233 | (2016.01) | |
| G09G 3/30 | (2006.01) | |

(52) U.S. Cl.
CPC .......... *H05B 33/10* (2013.01); *G09G 3/3233* (2013.01); *H01L 51/56* (2013.01); *G09G 3/30* (2013.01); *G09G 2300/0842* (2013.01); *G09G 2310/0283* (2013.01); *G09G 2310/08* (2013.01); *G09G 2330/02* (2013.01); *G09G 2330/028* (2013.01); *H01L 2251/562* (2013.01)

(58) Field of Classification Search
CPC .............. H01L 2251/562; H01L 51/56; G09G 2300/0842; G09G 2310/0283; G09G 2310/08; G09G 2330/02; G09G 2330/028; G09G 3/30; G09G 3/3233; H05B 33/10

See application file for complete search history.

(56) References Cited

U.S. PATENT DOCUMENTS

| | | |
|---|---|---|
| 2005/0225683 A1 | 10/2005 | Nozawa |
| 2006/0139254 A1 | 6/2006 | Nayakawa et al. |
| 2008/0169460 A1* | 7/2008 | Yoo .......... H05B 45/60 257/40 |
| 2010/0006866 A1 | 1/2010 | Koyama |
| 2010/0309178 A1 | 12/2010 | Tomida et al. |

FOREIGN PATENT DOCUMENTS

| | | |
|---|---|---|
| CN | 1717130 A | 1/2006 |
| CN | 1768363 A | 5/2006 |
| CN | 101751858 A | 6/2010 |
| CN | 105070250 A | 11/2015 |
| CN | 105303999 A | 2/2016 |
| WO | 2004/088624 A1 | 10/2004 |

OTHER PUBLICATIONS

Office Action dated Dec. 15, 2020 issued in Chinese Patent Application No. 201810681231.1 w/English Translation (21 pages).

* cited by examiner

*Primary Examiner* — Joseph L Williams
*Assistant Examiner* — Jacob R Stern
(74) *Attorney, Agent, or Firm* — Polsinelli PC

(57) ABSTRACT

An electroluminescence display and a method for driving the same are provided to enhance the aging performance of the electroluminescence display. The electroluminescence display comprises: a display panel on which a plurality of pixels each comprising an electroluminescence element; and a power supply part that outputs a drive voltage for driving the pixels, wherein an externally applied aging signal is applied to a cathode of the electroluminescence element to perform aging on the display panel.

16 Claims, 8 Drawing Sheets

ELECTROLUMINESCENCE DISPLAY AND METHOD FOR DRIVING THE SAME

CROSS REFERENCE TO RELATED APPLICATION

This application claims the benefit of Korean Patent Application No. 10-2017-0090363 filed on Jul. 17, 2017, which is incorporated herein by reference in its entirety for all purposes as if fully set forth herein.

BACKGROUND

Field of the Disclosure

The present disclosure relates to an electroluminescence display and a method for driving the same.

Description of the Background

Electroluminescence displays can be classified into inorganic light-emitting displays and organic light-emitting displays depending on the material of an emission layer. Of these, an active-matrix organic light emitting display comprises organic light-emitting diodes (hereinafter, "OLED"), which are typical light-emitting diodes that emit light themselves, and has advantages of fast response time, high luminous efficiency, high brightness, and wide viewing angle.

An OLED of an organic light-emitting display comprises an anode, a cathode, and an organic compound layer disposed between these electrodes. The organic compound layer consists of a hole injection layer (HIL), a hole transport layer (HTL), an emission layer (EML), an electron transport layer (ETL), and an electron injection layer (EIL). When a power voltage is applied to the anode and the cathode, holes passing through the hole transport layer HTL and electrons passing through the electron transport layer ETL move to the emission layer EML, forming excitons. As a result, the emission layer EML generates visible light.

An electroluminescence display comprises a plurality of pixel circuits formed at the intersections of scan lines, light emission control lines, and data lines. Each pixel circuit comprises a drive transistor that operates on a data signal supplied from a data line, a capacitor for storing voltage between source and gate electrodes of the drive transistor, and an organic light-emitting element that emits light by a drive current controlled by a plurality of transistors and the drive transistor.

By and large, an organic light-emitting display is manufactured through a manufacturing process for forming a thin-film transistor (TFT) and a manufacturing process for forming an organic-light emitting element on the thin-film transistor.

In the manufacturing process for forming an organic light-emitting element layer, impurities stuck between anode and cathode may cause short circuits, leading to dark defects.

To solve this, an aging process is carried out to eliminate such dark defects caused by short-circuits by applying a constant voltage to the organic light-emitting display. Also, there is a need for a solution to enhance aging performance in order to improve product reliability and product yield.

The present disclosure provides an electroluminescence display capable of enhancing aging performance by eliminating defects caused by short-circuits between the anode and the cathode of the electroluminescence display, and a method for driving the same.

SUMMARY

Accordingly, the present disclosure is directed to an electroluminescence display and a method for driving the same that substantially obviate one or more of problems due to limitations and disadvantages of the prior art.

More specifically, the present disclosure provides an electroluminescence display comprising: a display panel on which a plurality of pixels each comprising an electroluminescence element; and a power supply part that outputs a drive voltage for driving the pixels, wherein an externally applied aging signal is applied to a cathode of the electroluminescence element to perform aging on the display panel.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

In an aspect of the present disclosure, an electroluminescence display includes a plurality of pixels each having an electroluminescence element of a display panel, the electroluminescence element having a cathode and an anode; a power supply part that outputs a drive voltage for driving the plurality of pixels; and wherein an externally applied aging signal is applied to the cathode of the electroluminescence element to perform aging of the display panel after forming the electroluminescence element.

In another aspect of the present disclosure, an electroluminescence display having a display panel includes an electroluminescence element at the display panel and having a cathode electrode and an anode electrode; a drive circuit part that drives the display panel; a power generator that generates an electrical power; a voltage converter that converts the generated electrical power to a suppliable voltage and outputs a drive voltage to the drive circuit part; and an aging-only pad and an aging signal line disposed in the cathode electrode and receiving an aging signal from an external power source through the cathode electrode of the electroluminescence element for aging of the display panel.

The power supply part may output the drive voltage to a drive circuit for driving the electroluminescence display.

During aging of the display panel, the drive voltage applied to the cathode from the power supply part may be turned off.

The power supply part may output a high-level voltage VDD, low-level voltage COM, and ground voltage GND for driving the display panel.

The aging signal may be in a voltage range in which reverse voltage is applied to the anode and cathode of the electroluminescence element.

During the aging, the ground voltage GND applied from a high-level voltage node VDD of the power supply part is applied to the anode of the electroluminescence element.

During the aging, the ground voltage GND outputted from the power supply part is applied to the ground GND of the display panel.

In another aspect, the present disclosure provides a method for driving an electroluminescence display comprising: a display panel on which a plurality of pixels each comprising an electroluminescence element; and a power supply part that outputs a drive voltage for driving the pixels, the method comprising: applying, by the power supply part, a high-level voltage VDD and a ground voltage GND to perform aging on the display panel; and applying an externally applied aging signal to a cathode of the electroluminescence element.

An electroluminescence display and a method for driving the same according to the present disclosure may enhance aging performance by maximizing the range of swing of cathode voltage and therefore extending the range of swing of an applicable aging signal.

Furthermore, an electroluminescence display and a method for driving the same according to the present disclosure may enhance aging performance by externally generating an aging signal required for aging and applying it to the cathode.

It is to be understood that both the foregoing general description and the following detailed description are exemplary and explanatory and are intended to provide further explanation of the disclosure as claimed.

BRIEF DESCRIPTION OF THE DRAWINGS

The accompany drawings, which are included to provide a further understanding of the disclosure and are incorporated on and constitute a part of this application illustrate aspects of the disclosure and together with the description serve to explain the principles of the disclosure.

In the drawings.

DETAILED DESCRIPTION

Figure 1:
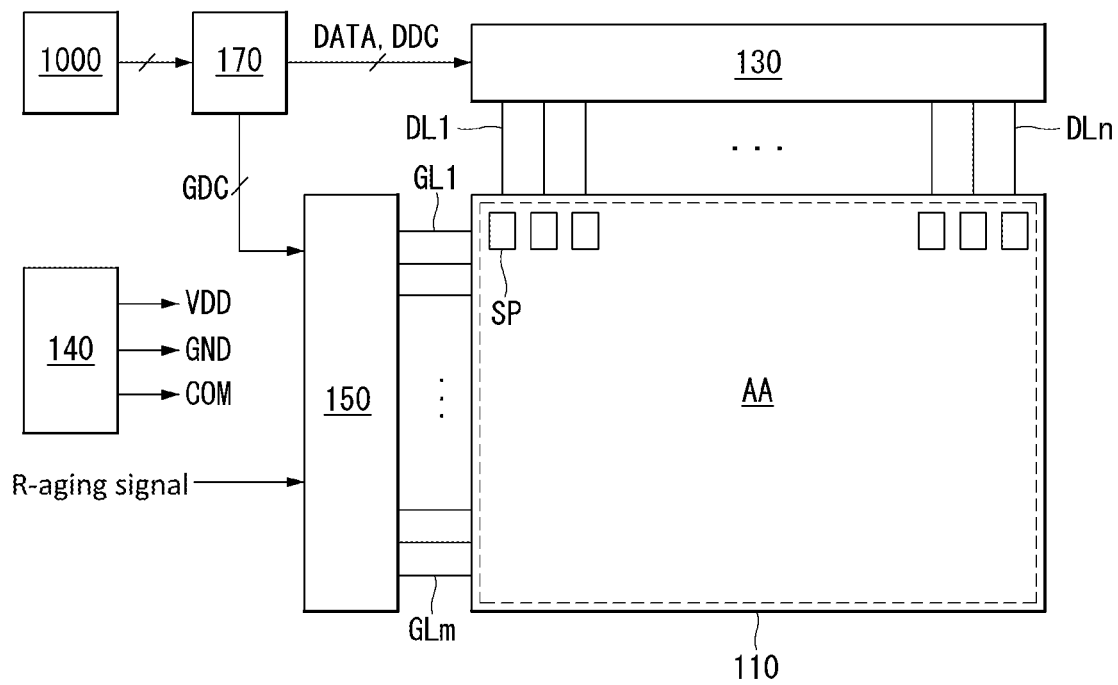
FIG. 1 is a schematic block diagram of an electroluminescence display.

Reference will now be made in detail aspects of the disclosure, examples of which are illustrated in the accompanying drawings.

Various aspects and features of the present disclosure and methods of accomplishing them may be understood more readily by reference to the following detailed descriptions of exemplary aspects and the accompanying drawings. The present disclosure may, however, be embodied in many different forms and should not be construed as being limited to the exemplary aspects set forth herein. Rather, these exemplary aspects are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the exemplary aspects of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms "on", "over", "under", "next to" and the like, one or more parts may be positioned between the two parts as long as the term "immediately" or "directly" is not used.

It will be understood that, although the terms "first", "second", etc. may be used herein to describe various elements, these elements are not limited by these terms. These terms are used to distinguish one element from another element. Thus, a first element mentioned below could also be termed as a second element without departing from the technical spirit of the present disclosure.

Like reference numerals denote substantially like elements throughout the specification.

The following exemplary aspects of the present disclosure may be coupled or combined with one another either partly or wholly, and may technically interact or work together in various ways. The exemplary aspects may be carried out independently or in connection with one another.

Hereinafter, various exemplary aspects of the present disclosure will be described in detail with reference to the accompanying drawings. In the exemplary aspects below, the description of the electroluminescence display will focus on an organic light-emitting display comprising organic light-emitting material. However, it should be noted that the technical idea of the present disclosure is not limited to organic light-emitting displays but may apply to inorganic light-emitting displays comprising inorganic light-emitting material.

An electroluminescence display may be implemented as top-emission type, bottom-emission type, or dual-emission type depending on the direction that emitted light exits.

The electroluminescence display may be implemented based on transistor semiconductor materials such as oxide, low-temperature polysilicon (LTPS), amorphous silicon (a-Si), or polysilicon (p-Si).

The electroluminescence display may be implemented in a television, a navigation device, a video player, a personal computer (PC), a wearable device (a watch, glasses, etc.), a mobile phone (smartphone), and so on.

FIG. 1 is a schematic block diagram of an electroluminescence display.

As shown in FIG. 1, the electroluminescence display comprises a host system 1000, a timing controller 170, a data driver 130, a power supply part 140, a gate driver 150, and a display panel 110.

The host system 1000 may comprise a system-on-chip (SoC) having a scaler incorporated in it, and convert digital video data of an input image into data signals of a format suitable for display on the display panel 110. The host system 1000 supplies various timing signals, along with the data signals, to the timing controller 170.

The timing controller 170 controls the operation timings of the data driver 130 and the gate driver 150 based on timing signals, such as a vertical synchronization signal, a horizontal synchronization signal, a data enable signal, and a main clock, received from the host system 1000. The timing controller 170 performs image processing (e.g., data compensation, etc.) on the data signals received from the host system 1000 and supplies them to the data driver 130.

The data driver 130 operates in response to a data control signal DDC outputted from the timing controller 170. The data driver 130 converts digital data signals DATA received from the timing controller 170 into analog data signals.

The data driver 130 converts digital data signals DATA into analog data signals in response to a gamma voltage from a gamma part located internally or externally. The data driver 130 supplies data signals to data lines DL1 to DLn on the display panel 110.

The gate driver 150 operates in response to a gate control signal GDC outputted from the timing controller 170 and outputs gate signals (or scan signals) of a gate-high voltage or gate-low voltage.

The gate driver 150 sequentially outputs gate signals in a forward or reverse direction and supplies gate signals to gate lines GL1 to GLm on the display panel 110.

The display panel 110 comprises a display part AA where a plurality of pixels SP is arranged to display an image and a non-display part located on the outside of the display part AA. The pixels SP are connected to the data lines DL1 to DLn and the gate lines GL1 to GLm. The display panel 110 displays an image in response to gate signals DATA from the data driver 130.

The power supply part 140 outputs a high-level voltage VDD, a low-level voltage COM, and a ground voltage GND to drive the display panel 110. The power supply part 140 may supply the high-level voltage VDD to the drain of the driving TFT DT of each pixel SP and the low-level voltage COM to the cathode. An aging signal R-aging is applied to the display panel 110. The aging signal R-aging may be supplied to the cathode to perform aging on the display panel 110.

Figure 2:
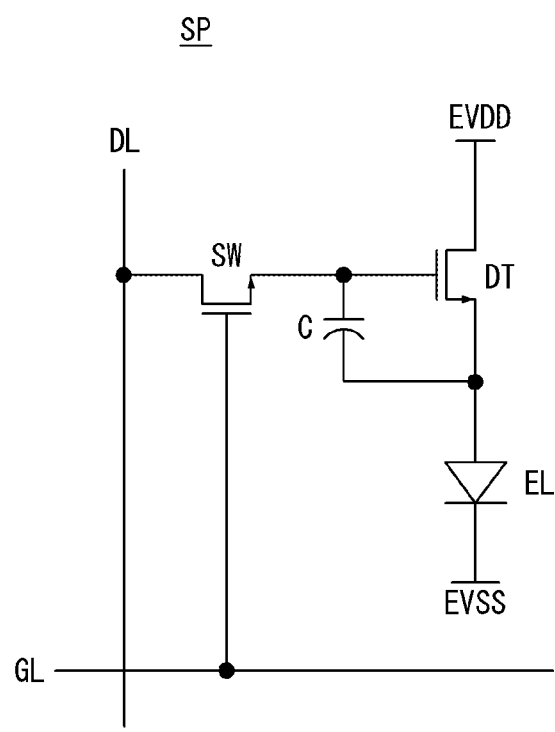
FIG. 2 is a circuit diagram showing an example of a pixel circuit in FIG. 1.

FIG. 2 is a circuit diagram showing an example of a pixel circuit in FIG. 1.

A single pixel SP comprises a switching thin-film transistor (hereinafter, referred to as "TFT") SW connected to a gate line GL and a data line DL, an organic light-emitting diode EL, and a driving TFT DT that controls the amount of current flowing through the organic light-emitting diode EL.

The switching TFT SW turns on in response to a scan signal from the gate line GL and applies a data voltage from the data line DL to one electrode of a storage capacitor C.

The driving TFT DT controls the amount of light emitted from the organic light-emitting diode EL by adjusting the amount of current supplied to the organic light-emitting diode EL in accordance with the level of voltage stored in the storage capacitor C.

Each pixel SP is connected to a high-level power supply voltage source EVDD and a low-level power supply voltage source EVSS to receive a high-level power supply voltage and a low-level power supply voltage. A circuit diagram in an active area AA where a plurality of pixels SP is arranged is as shown in FIG. 3.

Figure 3:
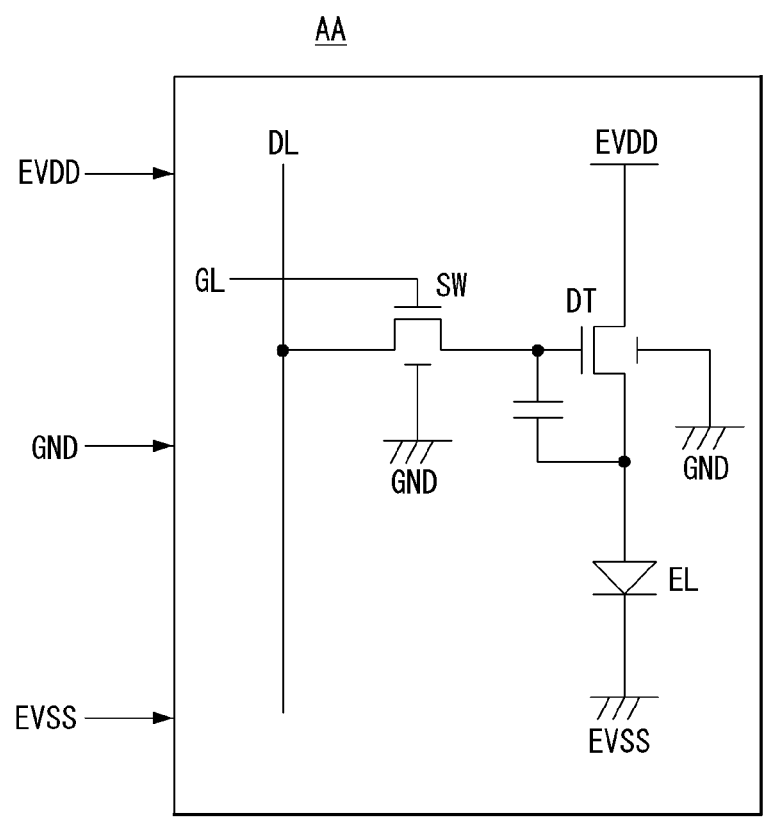
FIG. 3 is a circuit diagram showing an equivalent circuit in the active area AA of FIG. 1.

FIG. 3 is a circuit diagram showing an equivalent circuit in the active area AA of FIG. 1.

A plurality of data lines DL and a plurality of gate lines GL intersect in the active area AA of the display panel 110, and pixels SP are arranged at the intersections in a matrix form.

Each of the pixels SP included in the display panel 110 is connected to a high-level power supply voltage source EVDD and a low-level power supply voltage source EVSS and receives power supply voltages for driving the pixel SP. GND is connected for protecting and stabilizing the switching transistor SW and the driving transistor DR.

The power supply part 140 generates and supplies a high-level voltage VDD, a low-level voltage COM, and the ground voltage GND required for driving the display panel 110.

As a consequence, the high-level power VDD generated by the power supply part 140 is applied to the high-level power supply voltage source EVDD, i.e., anode of each pixel SP, and the low-level power COM generated by the power supply part 140 is applied to the low-level power supply voltage source EVSS, i.e., cathode of each pixel SP.

With this configuration, the pixels SP of the electroluminescence display are formed by depositing an anode layer, an organic film layer, and a cathode layer on a substrate. Through this organic material deposition process, short-circuits may occur due to impurities stuck between the anode layer and the cathode layer. Thus, an aging process is performed on a produced electroluminescence display before performing a module configuration.

Figure 4:
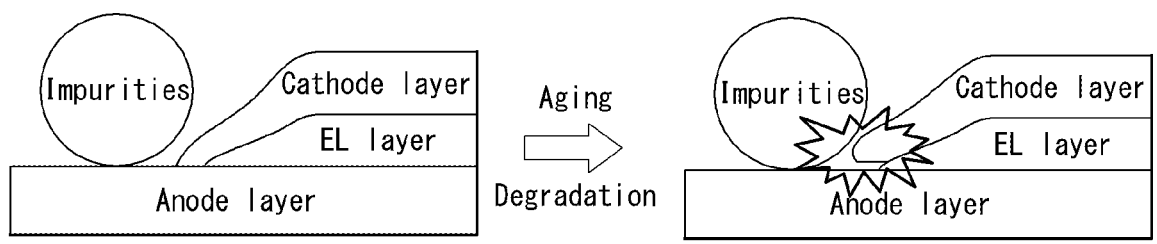
FIG. 4 is a view illustrating the principle of aging of an electroluminescence display.

FIG. 4 is a view illustrating the principle of aging of an electroluminescence display.

Referring to FIG. 4, the electroluminescence display includes pixels formed by depositing an anode layer, an organic film layer, and a cathode layer on a silicon wafer. However, short-circuits may occur between the anode and the cathode due to impurities or the like. When the anode and the cathode are short-circuited, a dark defect can occur in the pixel.

To prevent this, aging is performed to apply an aging signal between the anode and the cathode, after components for the display panel are formed on a substrate. The aging signal is a reverse current signal that is applied between the anode and the cathode. When a reverse current is applied, impurities and short-circuit parts of the anode and cathode are separated by the heat produced by a thermal reaction, thereby clearing the short-circuit condition.

In the present disclosure, an aging signal is applied directly to the cathode to sufficiently extend the range of swing of reverse current used for aging.

Figure 5:
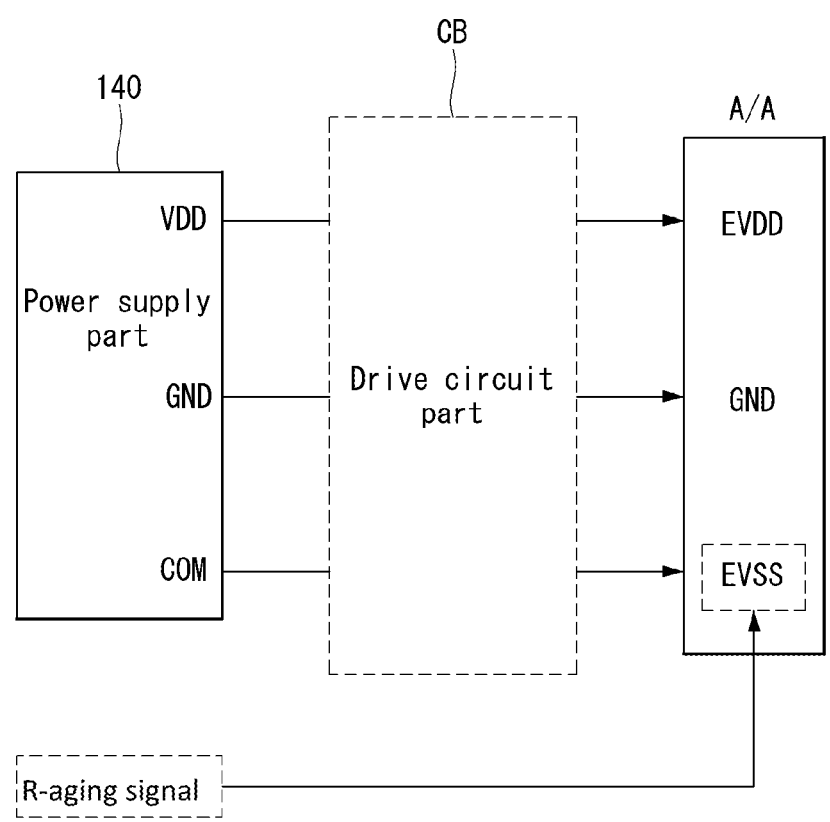
FIG. 5 is a view showing a power supplying method for an electroluminescence display according to the present disclosure.

FIG. 5 is a view showing a power supplying method for an electroluminescence display according to the present disclosure.

The power supply part 140 outputs a high-level voltage VDD, a low-level voltage COM, and a ground voltage GND for driving the display panel 110. Typically, the high-level voltage VDD may have a voltage range of −0.3 V to +5.5 V, and the low-level voltage COM may have a voltage range of −8.0 V to 0.3 V. The ground voltage GND is 0 V.

The electrical power outputted from the power supply part 140 is applied as driving power to each drive circuit CB for driving the electroluminescence display and also applied as driving power to the active area AA of the display panel 110.

The high-level voltage VDD outputted from the power supply part 140 is applied to a high-level power supply voltage source EVDD in the active area AA, and the low-level voltage COM outputted from it is applied to a low-level power supply voltage source EVSS, i.e., cathode, in the active area AA.

When aging is performed on the electroluminescence display, an aging signal is applied to the low-level power supply voltage source EVSS, i.e., cathode in the active area AA via a separate input line, apart from the power input line of the power supply part 140.

Since the aging signal is an external signal which is applied regardless of the power supply part 140, the aging signal may have a voltage level the user wants and be applied directly to the cathode, without interfering with other circuit components such as a drive circuit part CB.

Figure 6:
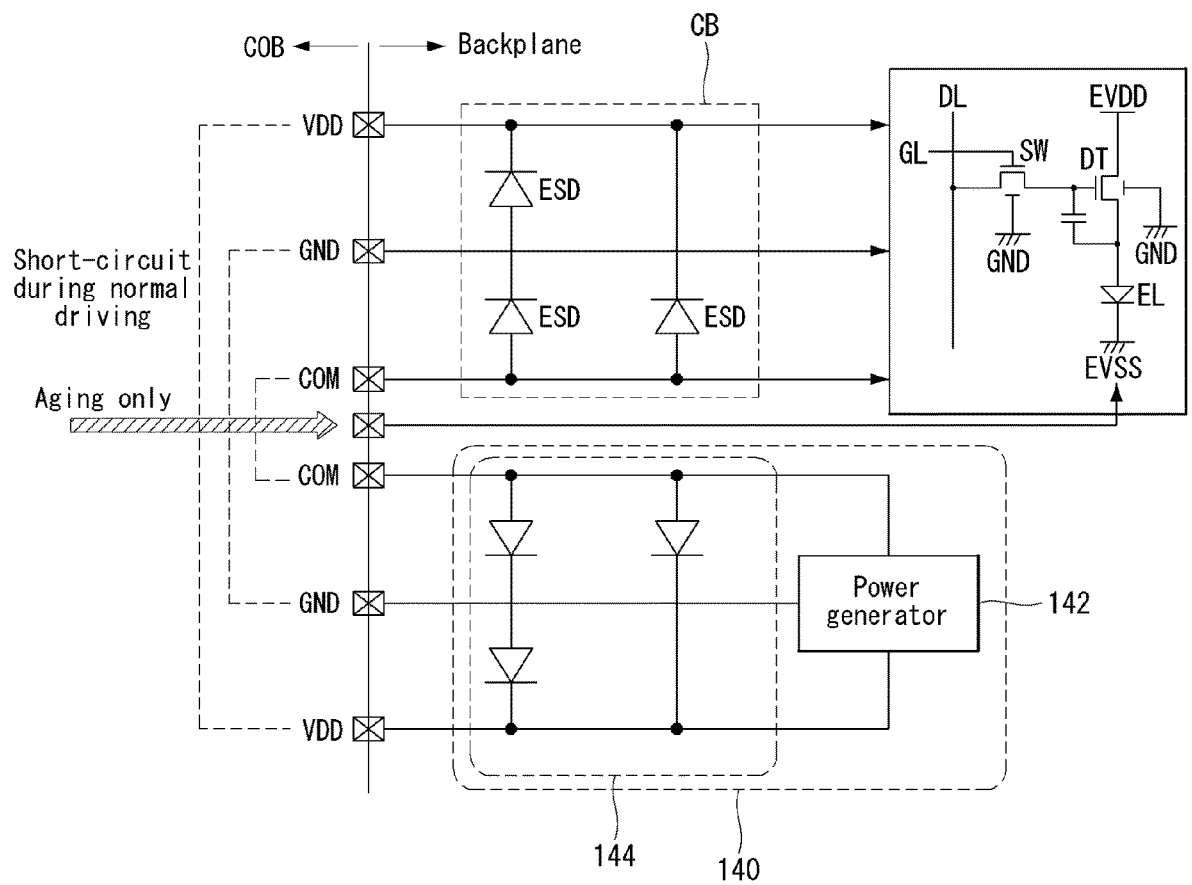
FIG. 6 is a view of parts of an electroluminescence display according to an exemplary aspect of the present disclosure.

FIG. 6 is a view of parts of an electroluminescence display according to an exemplary aspect of the present disclosure.

Referring to FIG. 6, the display panel 110 and power supply part 140 of the electroluminescence display and the drive circuit part CB for driving the electroluminescence display may be formed on a single backplane.

The power supply part 140 may comprise a power generator 142 that generates electrical power and a voltage converter 144 that converts the generated electrical power to a suppliable voltage. The power supply part 140 may generate and output a high-level voltage VDD, a low-level voltage COM, and a ground voltage GND. The power supply part 140 may be formed on the backplane or on a separate backplane.

In normal driving, power supply lines of the power supply part 140 and power supply lines of the circuit components in the drive circuit part CB and display panel 110 are connected together. In this regard, the circuit components in the drive circuit part CB and in the active area AA of the display panel 110 receive the electrical power outputted from the power supply part 140 as driving power. The electrical power outputted from the power supply part 140 is applied as driving power to the drive circuit part CB and also applied as driving power to the active area AA of the display panel 110. The high-level voltage VDD outputted from the power supply part 140 is applied to a high-level power supply voltage source EVDD in the active area AA, and the low-level voltage COM outputted from it is applied to a low-level power supply voltage source EVSS, i.e., cathode in the active area AA.

The backplane of the electroluminescence display according to the present disclosure comprises an aging-only pad for applying an aging signal to a cathode EVSS and a signal line. In this regard, during aging, an aging signal, instead of the low-level voltage COM outputted from the power supply part 140, is applied to the cathode EVSS.

In this way, an externally generated aging signal may be applied to the cathode EVSS, and therefore there is no limitation on the voltage of the cathode EVSS and the range of swing of maximum reverse voltage that can be applied to two ends of the OLED. Accordingly, an aging signal of the most efficient voltage level may be generated and applied directly to the cathode EVSS, thereby maximizing aging performance.

Figure 7:
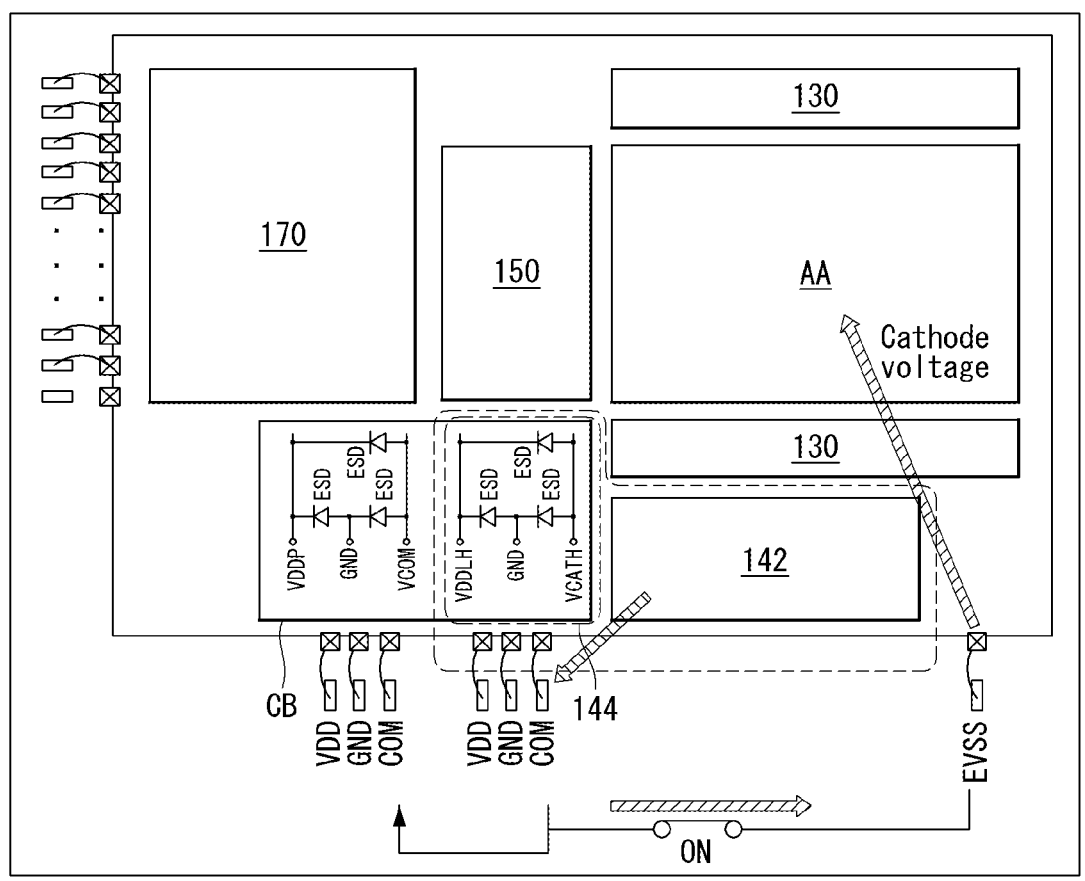
FIGS. 7 and 8 are views of parts of an electroluminescence display illustrating a power supplying method according to an exemplary aspect of the present disclosure.
Figure 8:
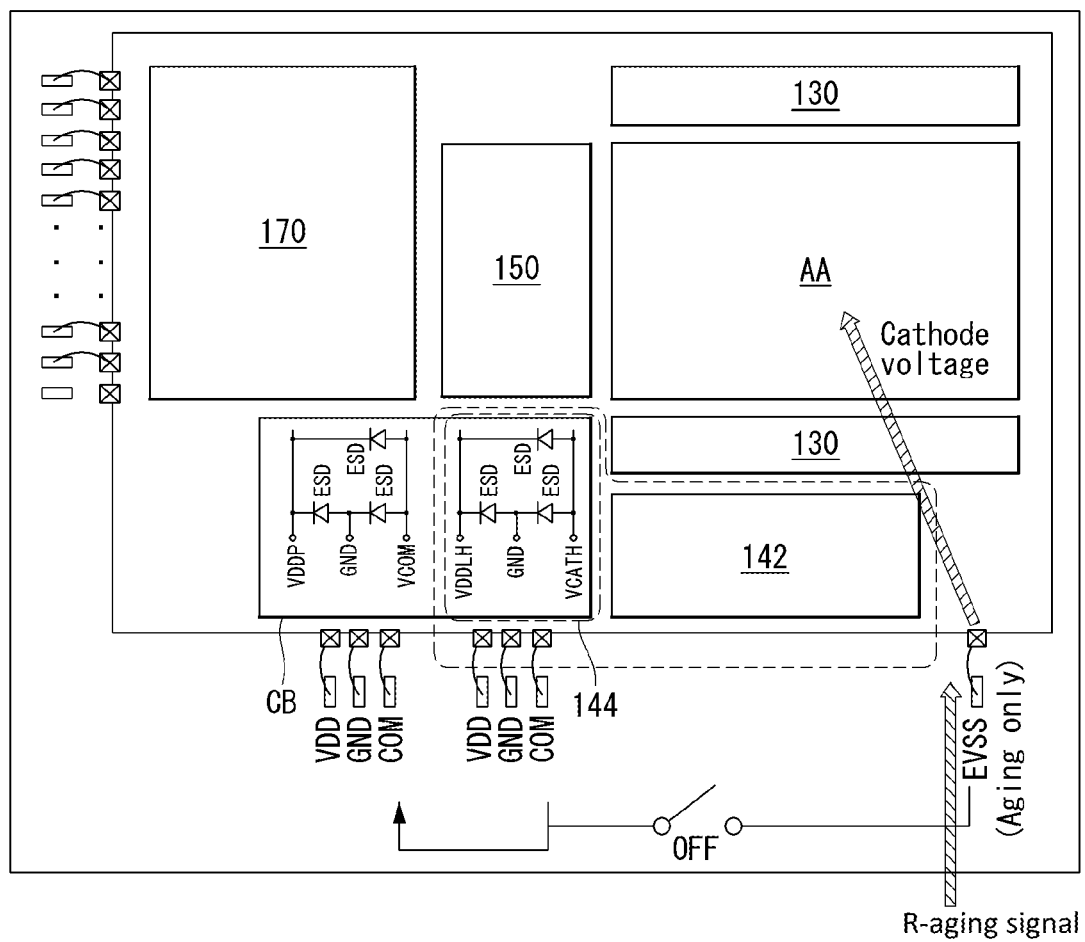

FIGS. 7 and 8 are views of parts of an electroluminescence display illustrating a power supplying method according to an exemplary aspect of the present disclosure.

As shown in FIGS. 7 and 8, the timing controller 170, the data driver 130, the power supply part 140, and the gate driver 150 of the electroluminescence display, the active area AA of the display panel, and the drive circuit part CB for driving the electroluminescence display may be formed on a single backplane.

The power supply part 140 may comprise a power generator 142 that generates electrical power and a voltage converter 144 that converts that converts generated electrical power to a suppliable voltage. The power supply part 140 may output the generated electrical power through high-level voltage pads VDD, ground pads GND, and low-level voltage pads COM.

The drive circuit part CB and the active area AA, which receive the electrical power generated by the power supply part 140, may receive driving power through the high-level voltage pads VDD, the ground pads GND, and the low-level voltage pads COM.

FIG. 7 shows a power input status during normal driving. The power supply pads VDD, GND, and COM for the power supply part 140 and the power supply pads VDD, GND, and COM for the drive circuit part CB and the display panel 110 are connected together.

In this regard, the electrical power outputted from the power supply part 140 is applied as driving power to the drive circuit part CB and also applied as driving power to the active area AA of the display panel 110. The high-level voltage VDD outputted from the power supply part 140 is applied to a high-level power supply voltage source EVDD in the active area AA, and the low-level voltage COM outputted from it is applied to a low-level power supply voltage source EVSS, i.e., cathode in the active area AA.

FIG. 8 shows a power input status during aging. The supply of the low-level voltage through the power supply pads for the power supply part 140 is selectively turned on or off.

The high-level voltage VDD and the ground voltage GND outputted from the power supply part 140 are applied as driving power to the drive circuit part CB and the active area AA.

During aging, the ground voltage GND applied from the high-level voltage node VDD of the power supply part 140 is applied to the anode of the electroluminescence element.

The low-level voltage COM outputted from the power supply part 140 is applied to the low-level voltage input pads COM for the drive circuits CB. However, the voltage input to the low-level power supply voltage source EVSS in the active area AA is turned off, and instead, an externally-applied aging signal is applied to the cathode.

As explained above, the electroluminescence display according to the present disclosure comprises an aging-only pad for applying an aging signal to a cathode and signal lines. In this regard, during aging, an externally generated aging signal, instead of the low-level voltage outputted from the power supply part, is applied to the cathode EVSS. Therefore, there is no limitation on the voltage of the cathode EVSS and the range of swing of maximum reverse voltage that can be applied to two ends of the OLED.

Accordingly, an aging signal of the most efficient voltage level may be generated and applied directly to the cathode EVSS, thereby maximizing aging performance.

Although exemplary aspects of the present disclosure are described above with reference to the accompanying drawings, it is understood that those skilled in the art may embody the technical configuration in other specific forms without changing the technical spirits and essential features of the present disclosure. Therefore, it should be understood that the aspects described above are exemplary and not restrictive in all aspects, and the scope of the present disclosure is defined by the appended claims rather than the above specific descriptions. It should be interpreted that all the changed and modified forms derived from the meaning, scope and equivalent concepts of the claims are included in the scope of the present disclosure.

What is claimed is:
1. An electroluminescence display comprising:
a plurality of pixels each having an electroluminescence element of a display panel, the electroluminescence element having a cathode and an anode;
a power supply part that outputs a drive voltage for driving the plurality of pixels; and
an aging-only pad and an aging signal line that are disposed in the cathode electrode and receive an aging signal from an external power source through the cathode electrode of the electroluminescence element for aging of the display panel.

2. The electroluminescence display of claim 1, wherein the power supply part outputs a drive voltage to a drive circuit for driving the electroluminescence display.

3. The electroluminescence display of claim 2, wherein, during the aging of the display panel, the drive voltage applied to the cathode from the power supply part is turned off.

4. The electroluminescence display of claim 1, wherein the power supply part outputs a high-level voltage VDD, a low-level voltage COM, and a ground voltage GND for driving the display panel.

5. The electroluminescence display of claim 1, wherein the aging signal is in a voltage range in which a reverse voltage is applied to the anode and cathode of the electroluminescence element.

6. The electroluminescence display of claim 1, wherein, during the aging, the ground voltage GND applied from a high-level voltage node VDD of the power supply part is applied to the anode of the electroluminescence element.

7. The electroluminescence display of claim 1, wherein, during the aging, the ground voltage GND outputted from the power supply part is applied to a ground node GND of the display panel.

8. An electroluminescence display having a display panel comprising:
 an electroluminescence element at the display panel and having a cathode electrode and an anode electrode;
 a drive circuit part that drives the display panel;
 a power generator that generates an electrical power;
 a voltage converter that converts the generated electrical power to a suppliable voltage and outputs a drive voltage to the drive circuit part; and
 an aging-only pad and an aging signal line that are disposed in the cathode electrode and receive an aging signal from an external power source through the cathode electrode of the electroluminescence element for aging of the display panel.

9. The electroluminescence display of claim 8, wherein the power generator and the voltage converter constitute a power supply part.

10. The electroluminescence display of claim 8, wherein the drive voltage applied to the cathode electrode from the power supply part is turned off during the aging of the display panel.

11. The electroluminescence display of claim 9, wherein the power supply part outputs a high-level voltage VDD, a low-level voltage COM, and a ground voltage GND for driving the display panel.

12. The electroluminescence display of claim 11, wherein the high-level voltage VDD is in a range of −0.3 V and +5.5 V, the low-level voltage COM is in a range of −8.0 V and +0.3 V and the ground voltage GND is 0 V.

13. The electroluminescence display of claim 8, wherein the aging signal is a reverse voltage that is applied to the anode electrode and the cathode electrode of the electroluminescence element.

14. The electroluminescence display of claim 8, wherein the ground voltage GND applied from a high-level voltage node VDD of the voltage converter is applied to the anode of the electroluminescence element during the aging of the display panel.

15. The electroluminescence display of claim 8, wherein, during the aging, the ground voltage GND outputted from the voltage converter is applied to a ground node GND of the display panel during the aging of the display panel.

16. The electroluminescence display of claim 8, further comprising a switch for turning on and off the aging signal.

\* \* \* \* \*